(12) United States Patent
Bleck et al.

(10) Patent No.: US 6,843,859 B1
(45) Date of Patent: Jan. 18, 2005

(54) DUMP DOOR

(75) Inventors: Martin Bleck, Eagle, ID (US); Wyland L. Atkins, Kuna, ID (US)

(73) Assignee: SCP Global Technologies, Inc., Boise, ID (US)

( * ) Notice: Subject to any disclaimer, the term of this patent is extended or adjusted under 35 U.S.C. 154(b) by 145 days.

(21) Appl. No.: 10/085,565

(22) Filed: Feb. 26, 2002

(51) Int. Cl.[7] .............................................. B08B 3/00
(52) U.S. Cl. ..................... 134/34; 134/186; 134/902; 251/318; 251/333
(58) Field of Search .............................. 134/34, 115 R, 134/136, 155, 183, 186, 902; 251/318, 333, 334; 4/640, 650, 653

(56) References Cited

U.S. PATENT DOCUMENTS

| 1,977,319 | A | * | 10/1934 | McEwan | 4/255.06 |
| 2,363,279 | A | * | 11/1944 | Anschicks | 251/110 |
| 2,404,450 | A | * | 7/1946 | Meyer | 68/58 |
| 2,443,816 | A | * | 6/1948 | Davis, Jr. | 137/583 |
| 2,595,603 | A | * | 5/1952 | Parsons | 251/61.2 |
| 2,893,423 | A | * | 7/1959 | Seney | 137/364 |
| 2,904,072 | A | * | 9/1959 | Palen | 137/627.5 |
| 2,953,345 | A | * | 9/1960 | Slemmons et al. | 251/144 |
| 2,969,951 | A | * | 1/1961 | Walton | 251/332 |
| 2,977,974 | A | * | 4/1961 | Browne | 137/243 |
| 2,998,825 | A | * | 9/1961 | Gleason et al. | 137/195 |
| 3,025,871 | A | * | 3/1962 | Roth et al. | 137/238 |
| 3,086,550 | A | * | 4/1963 | Cummings | 137/514 |
| 3,266,518 | A | * | 8/1966 | Erickson et al. | 137/577 |
| 3,394,732 | A | * | 7/1968 | Lisciani | 137/533.21 |
| 3,503,416 | A | * | 3/1970 | Clarkson | 137/375 |
| 3,566,415 | A | * | 3/1971 | Culp | 4/431 |
| 4,225,111 | A | * | 9/1980 | Stahle | 251/87 |
| RE32,750 | E | * | 9/1988 | Grills et al. | |
| 5,000,207 | A | * | 3/1991 | Titterington et al. | 134/44 |
| 5,069,235 | A | * | 12/1991 | Vetter et al. | 134/113 |
| 5,148,823 | A | * | 9/1992 | Bran | 134/184 |
| 5,656,097 | A | * | 8/1997 | Olesen et al. | 134/1 |
| 5,813,656 | A | * | 9/1998 | Miranda | 251/144 |

FOREIGN PATENT DOCUMENTS

JP            56-80560         *   7/1981

* cited by examiner

Primary Examiner—Frankie L. Stinson
(74) Attorney, Agent, or Firm—Stallman & Pollock LLP

(57) ABSTRACT

A compliant door assembly for use in sealing an opening in a vessel bottom includes a door having a sealing wall, the sealing wall having a contact face moveable into contact with a wall surrounding the vessel bottom. A reinforcing member is moveable into contact with the back face of the sealing wall, thereby reinforcing sealing contact between the contact face and the wall surrounding the opening.

26 Claims, 4 Drawing Sheets

DUMP DOOR

FIELD OF THE INVENTION

The present invention relates to the field of process vessels for use in subjecting objects to treatment fluids, and specifically to dump doors for rapidly evacuating treatment fluids from process vessels.

BACKGROUND OF THE INVENTION

In various manufacturing processes, components undergoing manufacture are subjected to chemicals or other fluids contained within a process vessel. One such manufacturing process is that of integrated circuit manufacture, during which semiconductor substrate materials are exposed to process fluids such as water and chemicals contained within a vessel for a purpose such as cleaning, etching, passivation, rinsing etc. A substrate may be exposed to fluids multiple times, at various stages of IC manufacture.

Oftentimes fluid exposure is carried out with the substrate supported in a process vessel containing flowing or static process fluid(s). Manifolding is typically provided in the bottom, sidewalls, and/or top of process vessels, and process fluids are directed into the vessel via this manifolding.

A typical wet processing vessel may also be provided with a so-called "dump door"—an elongate door sealing an opening in the bottom of the vessel. The dump door remains in a closed position covering the opening when fluid is to be contained in the vessel, and is moved to an opened position to allow the fluid to exit the vessel via the opening. In many instances, opening the dump door results in rapid evacuation of the fluid from the vessel. Certain processes such as rinsing are enhanced by rapid draining, because the shear forces formed in the rapidly draining fluid shear droplets of rinse fluid from the substrate surfaces. Some commercially available dump doors are provided with manifolding through which process fluids may be delivered to the vessel.

It has been found that process vessels having a rectangular shape drain more quickly and more uniformly when provided with a dump door having a slightly oval shape. However, oval shaped dump doors are more difficult to seal than rectangular doors, due to manufacturing tolerance issues. It is thus desirable to provide a dump door having compliant features that allow for consistent sealing regardless of tolerance variations. It is also desirable to optionally provide the dump door with fluid manifolding, allowing process fluids to be delivered to the vessel via the manifolding in the dump door.

SUMMARY OF THE INVENTION

A compliant door assembly for use in sealing an opening in a vessel bottom includes a door having a sealing wall, the sealing wall having a contact face moveable into contact with a wall surrounding the vessel bottom. A reinforcing member is moveable into contact with the back face of the sealing wall, thereby reinforcing sealing contact between the contact face and the wall surrounding the opening.

DETAILED DESCRIPTION OF THE DRAWINGS

Figure 1A:
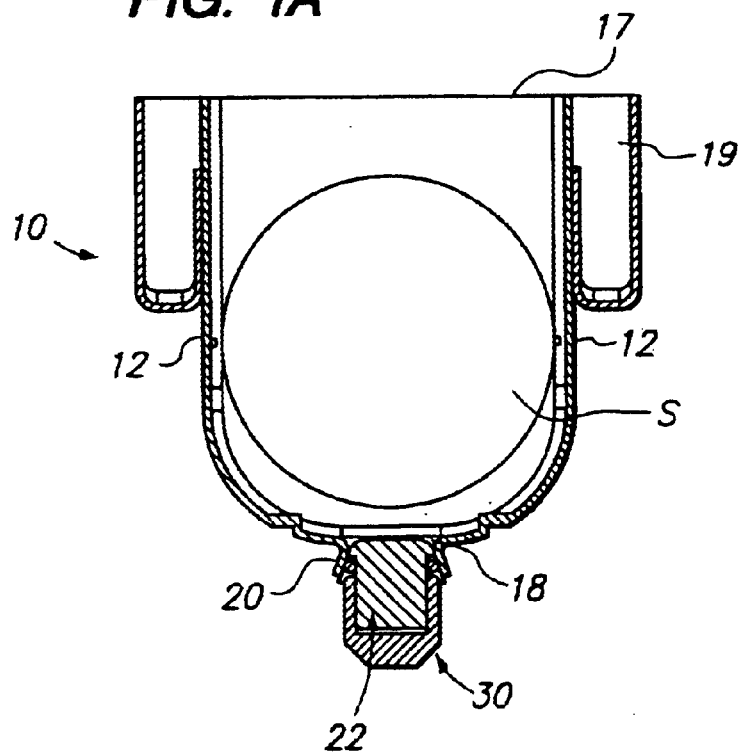
FIG. 1A is a cross-sectional end view of a process vessel utilizing a compliant dump door assembly.
Figure 1B:
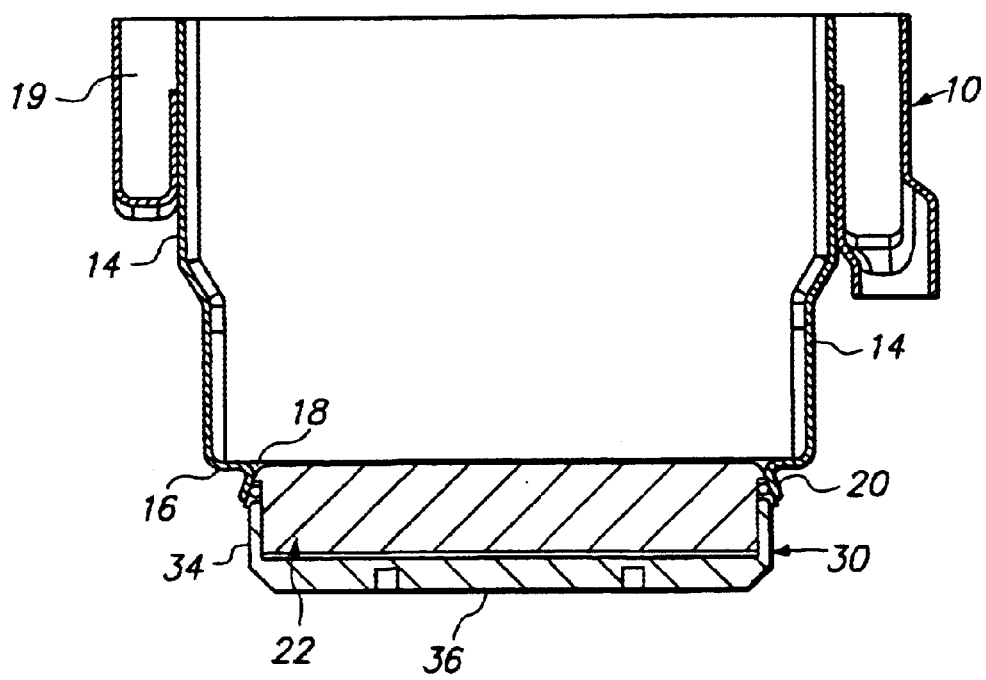
FIG. 1B is a cross-sectional side view of the process vessel and compliant dump door assembly of FIG. 1A.

FIGS. 1A and 1B illustrate one type of a process vessel 10 having a compliant dump door, Although one type of process vessel is shown, it should be understood that this process vessel is shown by way of example, since the compliant dump door is suitable for use with vessels of a variety of shapes and configurations.

Process vessel 10 includes sidewalls 12, end walls 14 and bottom 16 joined in a substantially rectangular configuration defining the vessel interior and forming an opening 17. One or more substrates S are moveable into and out of the vessel via opening 17. The substrates S are supported within the vessel interior using a variety of wafer support devices (not shown) including process cassettes or other furniture within the vessel, or they may be suspended from above by end effectors. Vessel bottom 16 may be shaped to approximately conform to the lower edges of the substrates as shown, or it may be flat or angular. The vessel may include a variety of other features, including those known in the art, such as an overflow weir 19 and a lid (not shown) covering opening 17.

An opening 18 is formed in the vessel bottom 16. Opening 18 preferably ovular in shape, having a pair of elongate sides and rounded ends. An ovular flange 20 extends from the bottom of the vessel and surrounds the opening 18. The walls of the flange 20 extend downwardly and outwardly from the vessel bottom as shown in FIGS. 1A and 1B. Flange 20 is preferably made of a polymer such as perfluoroalkoxy (PFA), polytetrafluoroethylene (PTFE) or polyvinylidene fluoride (PVDF).

Figure 2:
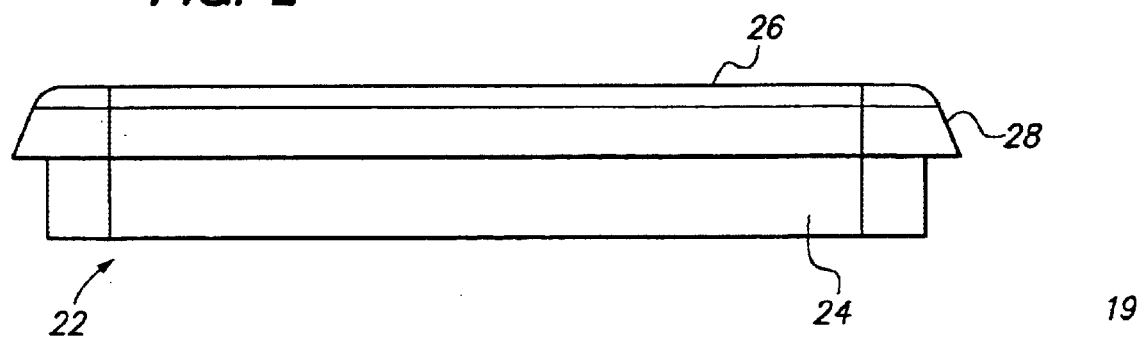
FIG. 2 is a side elevation view of the compliant dump door of FIG. 1A, independent of the stiffening beam.
Figure 3:
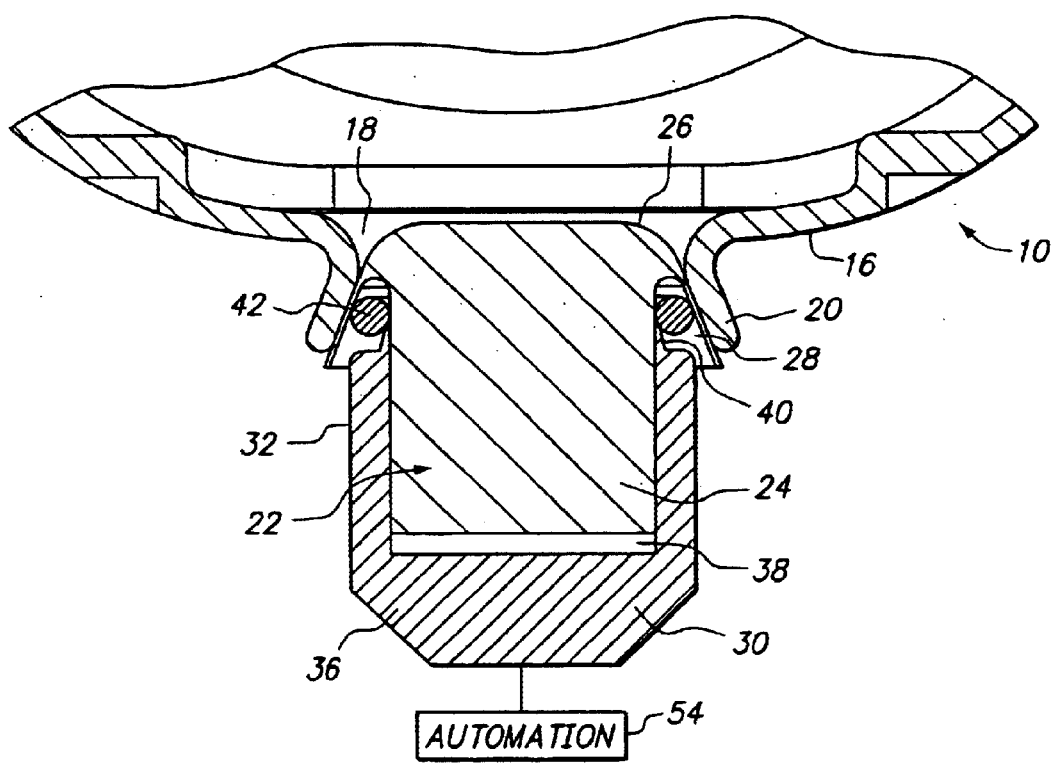
FIG. 3 is a cross-sectional end view of a lower portion of the process vessel and the compliant dump door assembly of FIG. 1A

Dump door 22 is an elongate door proportioned to be received within the walls of the flange 20 as shown. Referring to FIGS. 2 and 3, the dump door 22 includes an elongate base portion 24 and a wedge-shaped upper portion, which includes an upper surface 26 and a flared wall member 28 extending downwardly and outwardly from the upper surface 26 to give the door the mushroom-like cross-section shown in FIGS. 1A, 1B and 3. Dump door 22 is preferably made of polytetrafluoroethylene (PTFE), sold under the trade name Teflon®. When in the closed position, the upwardly facing surfaces of flared wall member 28 make sealing contact with flange 20 of the process vessel 10.

A stiffener beam 30, preferably formed of PVDF, PVC or similar material that is considerably more rigid than the dump door material, is slidably positioned over base portion 24 of dump door 22. In this description, the term "dump door assembly" may be used to denote the dump door and stiffening beam. Although the stiffener beam may be configured in a number of ways without departing from the scope of the invention, stiffener beam 30 preferably includes side walls 32, end walls 34, a bottom 36 and an opening 38 slidably received over base portion 24. The uppermost regions of sidewalls 32 and end walls 34 include upwardly tapered wedge 40.

An o-ring seal 42 surrounds base portion 24 and is disposed beneath flared wall member 28. Wedge 40 of stiffener beam 30 is disposed such that upward movement of stiffener beam 30 relative to dump door 22 causes wedge 40 to drive o-ring seal 42 laterally outwardly, where it bears against flared wall member 28, thereby tightening the seal between wall member 28 and flange 20 of the process vessel 10.

An automation system 54, shown schematically in FIG. 3, is provided for moving the dump door 22 towards and away from opening 18. The automation system 54 is attached to stiffener beam 30 and is preferably activated by hydraulic or pneumatic means.

Figure 4:
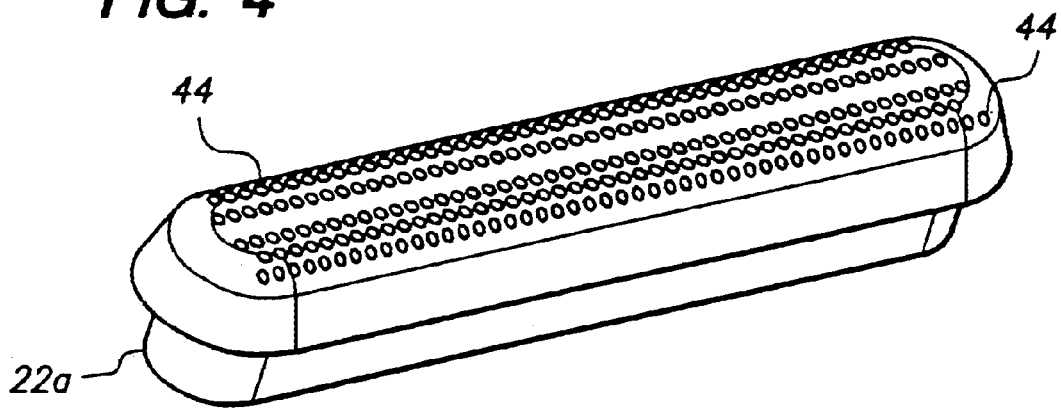
FIG. 4 is a perspective view of a compliant dump door similar to the dump door of FIG. 1A but also including fluid manifolds.
Figure 5:
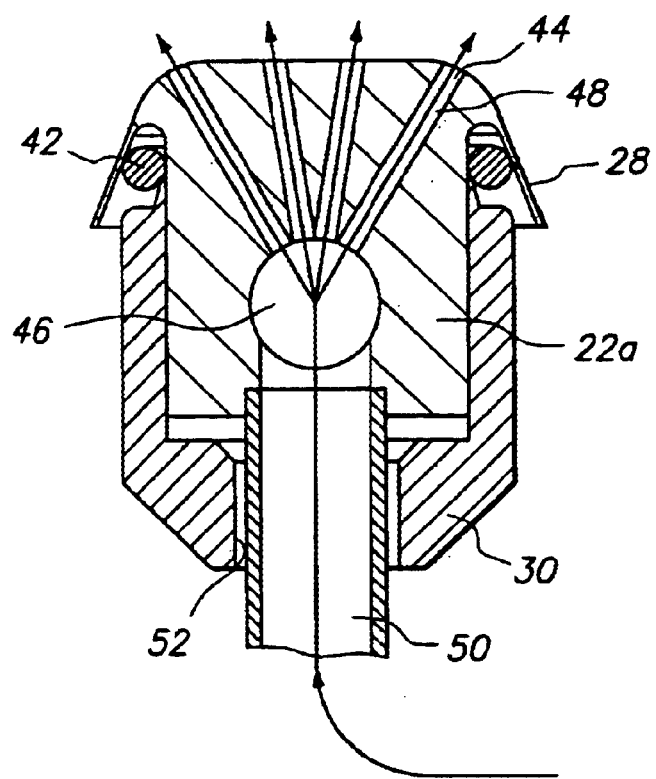
FIG. 5. is a cross-sectional end view of the compliant dump door of FIG. 4, as assembled with a stiffening beam.

The dump door may be optionally provided with fluid manifolds that allow fluids (e.g. liquids and/or gases) to be introduced into the process vessel via the dump door. Referring to FIGS. 4 and 5, dump door 22a may include porting for delivering fluid into the process vessel. The type of porting provided in the manifold is selected based upon the type of flow desired, and may include dispersion holes 44 (as shown) or slots, spray nozzles etc. Referring to FIG. 5, conduit 46 extends longitudinally through dump door 22a and flow paths 48 extend between conduit 46 and dispersion holes 44 (or other porting). A fluid line 50 is coupled between conduit 46 and a source of process fluid (not shown). An opening 52 is formed in the stiffener beam 30a to accommodate the fluid line 50.

Operation of the dump door 22 is as follows. To seal the process vessel 10, the automation system 54 is activated to move the dump door assembly upwardly and to position the dump door 22 within opening 18. Eventually, upward movement of dump door 22 ceases as the wall member 28 makes contact with flange 20. Continued activation of the automation system causes stiffener beam 30 to slide upwardly relative to dump door 22. This relative upward movement causes wedge 40 to drive o-ring seal 42 laterally outwardly, where it bears against flared wall member 28 and thus tightens the seal between wall member 28 and flange 20 of the process vessel 10.

If the dump door 22a having fluid manifolds is used, fluid (liquid and/or gas) is introduced into the manifold via fluid line 50 and enters the process vessel through dispersion holes 44.

When it is necessary to rapidly drain the process vessel, the automation system withdraws the dump door assembly from the opening 18, allowing fluid in the vessel to flow rapidly out of the opening 18.

Figure 6A:
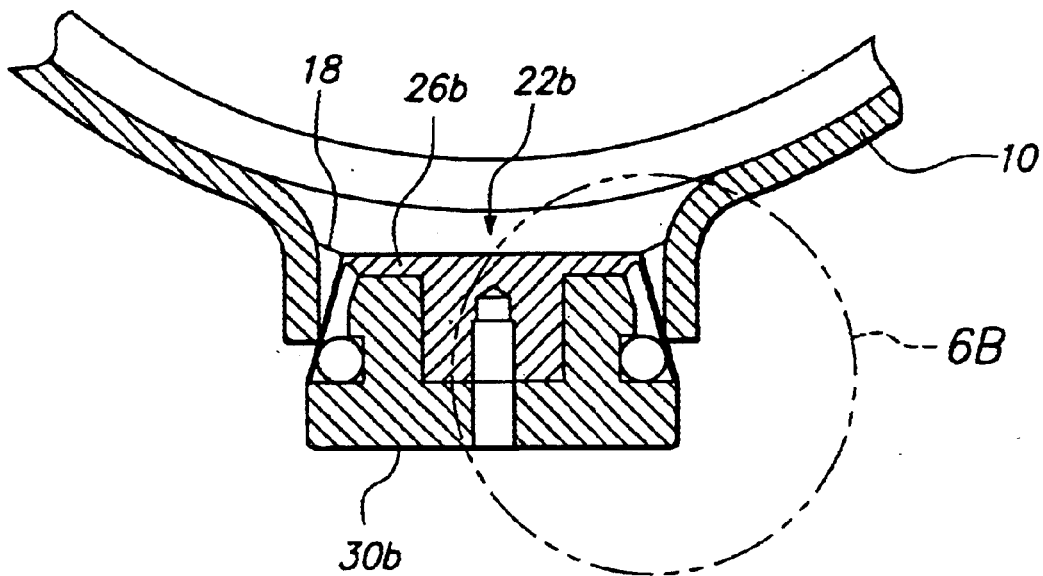
FIG. 6A is a cross-sectional end view, similar to FIG. 3, showing a lower portion of a process vessel and an alternate dump door assembly.
Figure 6B:
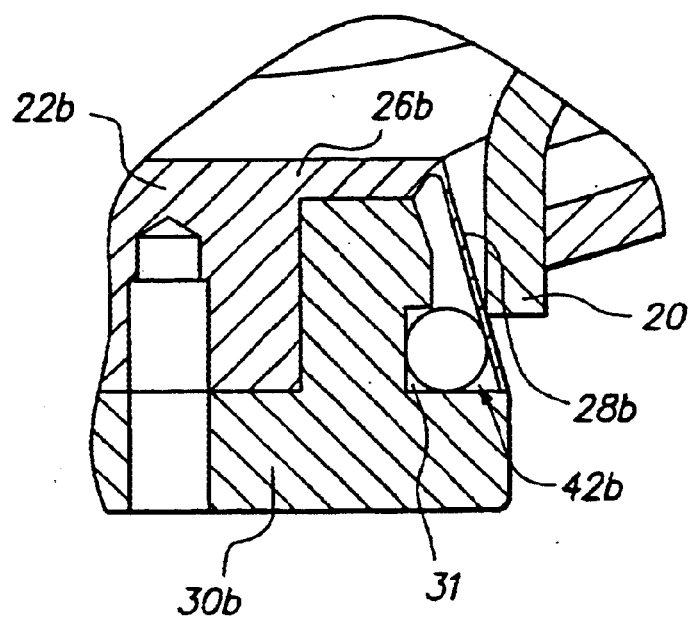
FIG. 6B is a detail view of a portion of the dump door shown in FIG. 6A, showing the region identified 6B—6B in FIG. 6A.

An alternative embodiment of a dump door 22b is shown in FIG. 6A. Dump door 22b, which is preferably made of PTFE or similar material, is an elongate door proportioned to be received within the walls of the flange 20 of the process vessel 10. The dump door 22b includes a wedge-shaped upper portion which includes an upper surface 26b and a flared wall member 28b extending downwardly and outwardly from the upper surface 26b. Stiffening member 30b, preferably made of a material more rigid than that of the dump door (e.g. PVC or PVDF), is secured to dump door 22b. Stiffening member 30b includes an annular groove 31, and an o-ring seal 42b is positioned within groove 31 and beneath wall member 28b. The flared wall member 30b is proportioned such that the dump door 22b and stiffening member 30b are moved to the closed position using the system automation, the wall member 28b provides a conformal sealing surface against the flange 20 of the process vessel. As with the first embodiment, the second embodiment may be provided with fluid manifolding in the dump door.

Two embodiments of a conformal dump door have been described. It is important to note that these embodiments have been shown and described by way of example and are not intended in a limiting sense, and it is anticipated that alterations and modifications thereof will become apparent to those skilled in the art. It is therefore intended that the scope of the invention is to be defined by the following claims and not limited by the specifics of the described embodiments.

We claim:

1. A method of sealing an opening in a vessel bottom, comprising the steps of:
    (a) providing a vessel having a bottom, an opening in the vessel bottom, and a first wall surrounding the opening;
    (b) providing a door having a sealing wall, the sealing wall having a contact face and a back face on the opposite side of the sealing wall from the contact face;
    (c) advancing the door towards the opening, causing the contact face of the sealing wall to contact the first wall; and
    (d) moving a reinforcing member into contact with the back face, thereby reinforcing contact between the contact face and the first wall.

2. The method of claim 1 wherein the first wall is a flanged wall.

3. The method of claim 2 wherein the sealing wall is a flanged wall.

4. The method of claim 1 wherein the reinforcing member includes an o-ring, and wherein step (d) includes moving the o-ring into contact with the back face.

5. The method of claim 4, wherein step (d) further includes advancing a wedge to move the o-ring into contact with the back face.

6. The method of claim 5, wherein:
    step (b) further provides a stiffening beam slidably disposed on the door, wherein the wedge is connected to the stiffening beam; and
    step (d) includes sliding the stiffening beam relative to the door to move the wedge into contact with the o-ring.

7. The method of claim 1 wherein the vessel is a process vessel for use in exposing semiconductor substrates to process fluids.

8. The method of claim 7, wherein the door is a dump door for use in rapidly draining fluids from the process vessel.

9. The method of claim 1, wherein the method is further for exposing an object to a treatment fluid, and wherein the method further includes the steps of:
    (e) after step (d), at least partially filling the vessel with a treatment fluid;
    (f) exposing the object to treatment fluid within the vessel; and
    (g) withdrawing the door from the opening to rapidly drain treatment fluid from the vessel.

10. The method of claim 1, wherein the method is further for exposing an object to a treatment fluid, and wherein the method further includes the steps of:
    providing a fluid manifold in the door;
    after step (d), flowing treatment fluid through the fluid manifold to at least partially fill the vessel with treatment fluid; and
    exposing the object to treatment fluid within the vessel.

11. The method of claim 10, further comprising the step of withdrawing the door from the opening to rapidly drain treatment fluid from the vessel.

12. A vessel and compliant door assembly, comprising:
a vessel having a bottom, an opening in the vessel bottom, and a first wall surrounding the opening;
a door having a sealing wall, the sealing wall having a contact face moveable into contact with the first wall, and a back face on the opposite side of the sealing wall from the contact face; and
a reinforcing member moveable into contact with the back face, thereby reinforcing contact between the contact face and the first wall.

13. The assembly of claim 12 wherein the first wall is a flanged wall.

14. The assembly of claim 13 wherein the sealing wall is a flanged wall.

15. The assembly of claim 12 wherein the reinforcing member includes an o-ring moveable into contact with the back face.

16. The assembly of claim 15, further including a wedge moveable against the o-ring to move the o-ring into contact with the back face.

17. The assembly of claim 16, further including a stiffening beam slidably disposed on the door, wherein the wedge is connected to the stiffening beam and wherein the stiffening beam is slidable relative to the door to move the wedge against the o-ring.

18. The assembly of claim 12 wherein the vessel is a process vessel for use in exposing semiconductor substrates to process fluids.

19. The assembly of claim 18, wherein the door is a dump door for use in rapidly draining fluids from the process vessel.

20. The assembly of claim 12, wherein the vessel is for use in exposing an object to a treatment fluid, and wherein the dump door is moveable away from the opening to rapidly drain treatment fluid from the vessel.

21. The assembly of claim 12, further including a fluid manifold in the door.

22. A vessel and compliant door assembly, comprising:
a vessel having a bottom, an opening in the vessel bottom, and a first wall surrounding the opening;
a door having a sealing wall, the sealing wall having a contact face moveable into contact with the first wall, and a back face on the opposite side of the sealing wall from the contact face, the sealing wall conformable with the first wall when advanced into contact with the first wall; and
a reinforcing member in contact with a portion of the back face, thereby reinforcing contact between the contact face and the first wall, the reinforcing member including an o-ring in contact with the back face.

23. The assembly of claim 22 wherein the reinforcing member further includes a stiffening member fixed to the door.

24. The assembly of claim 22 wherein the sealing wall is a flanged wall.

25. The assembly of claim 22, wherein the o-ring is disposed between the stiffening member and the back face.

26. The assembly of claim 22, further including a fluid manifold in the door.

* * * * *